United States Patent [19]

Fukasawa

[11] Patent Number: 5,519,233
[45] Date of Patent: May 21, 1996

[54] MICROCHIP CAPACITOR AND THIN FILM RESISTOR AS CIRCUIT ELEMENTS IN INTERNAL IMPEDANCE MATCHING CIRCUIT OF MICROWAVE TRANSISTOR

[75] Inventor: Tomoyoshi Fukasawa, Yamagata, Japan

[73] Assignee: NEC Corporation, Tokyo, Japan

[21] Appl. No.: 253,867

[22] Filed: Jun. 3, 1994

[30] Foreign Application Priority Data

Jun. 4, 1993 [JP] Japan ..................................... 5-133742

[51] Int. Cl.⁶ .......................... H01L 29/80; H01L 31/112
[52] U.S. Cl. .......................... 257/275; 257/277; 257/536; 257/537; 257/728
[58] Field of Search .......................... 257/533, 536–538, 257/275, 277, 728

Primary Examiner—Rolf Hille
Assistant Examiner—T. M. Arroyo

[57] ABSTRACT

A microchip capacitor used as a circuit element in internal impedance matching circuits of microwave transistors is disclosed. A thin film resistor is used to make interconnection between two first metallized patterns in a paired electrode structure, and a pair of microstrip lines are used to make interconnection between the two first metallized patterns and the second metallized pattern. The thin film resistor and the microstrip lines form a Wilkinson type synthetic circuit wherein a signal flowing in the thin film resistor and a signal flowing in the microstrip lines cancel each other. An isolation between the first and second metallized patterns is improved.

4 Claims, 4 Drawing Sheets

ND THIN FILM
MICROCHIP CAPACITOR AND THIN FILM RESISTOR AS CIRCUIT ELEMENTS IN INTERNAL IMPEDANCE MATCHING CIRCUIT OF MICROWAVE TRANSISTOR

BACKGROUND OF THE INVENTION (1) Field of the Invention

This invention relates to microchip capacitors, and more particularly to microchip capacitors used as circuit elements in internal impedance matching circuits of microwave transistors.

(2) Description of the Related Art

A prior art microchip capacitor of the kind to which the present invention relates is shown in FIG. 1. In this microchip capacitor, one or more metallized patterns 8 are provided on the principal front surface of a dielectric substrate 1, and the principal back surface thereof is entirely metallized.

FIG. 2 shows another example of prior art microchip capacitors. In this microchip capacitor, the principal front surface of a dielectric substrate 1 is provided with one or more first metallized patterns 2 and also provided with second metallized patterns 3 each for a plurality of first metallized patterns 2, the principal back surface of the substrate being fully metallized.

In operation, both the capacitors of FIG. 1 and FIG. 2 function as parallel flat layer capacitor. Particularly, in the microchip capacitor of FIG. 2, two different capacitances are provided in a single dielectric substrate 1 by the first and second metallized patterns 2 and 3.

FIG. 3 illustrates the use of the microchip capacitor of FIG. 2 as circuit constants of an internal impedance matching circuit of a microwave transistor. Transistor chips in the microwave transistor 2 and the first metallized patterns 2 of the microchip capacitor are connected to one another by bonding wires 7. Also, the first and second metallized patterns 2 and 3 on the microchip capacitor are connected to one another by the bonding wires 7.

FIG. 4 is a circuit diagram showing an equivalent electric circuit of the structure shown in FIG. 3. The first and second metallized patterns 2 and 3 of the microchip capacitor function as capacitances C1 and C2, while the bonding wires function as inductances L1 and L2.

In the above prior art microchip capacitor, however, if there occur variations in the internal impedances of the bonding wires 7 connected to the individual electrode patterns and the microwave transistor 6, the load impedances connected to the individual electrodes will become unbalanced among the individual electrodes, and this causes the occurrence of interference resulting in operational instability, such as abnormal oscillation, of the microwave transistor.

SUMMARY OF THE INVENTION

An object of the invention, therefore, is to overcome the problems existing in the prior art and to provide an improved microchip capacitor which has divided electrodes arranged such that, when fluctuations of load impedances connected to the individual electrodes are produced, interference of the electrodes is suppressed resulting in stable operation of the circuit.

According to one aspect of the invention, there is provided a microchip capacitor having an electrode structure including a plurality of first metallized patterns and at least one second metallized pattern provided on a dielectric substrate, the first metallized patterns and the second metallized pattern constituting a paired electrode structure with two of the first metallized patterns combined with the one second metallized pattern, the electrode structure comprising:

a thin film resistor making interconnection between the two first metallized patterns in the paired electrode structure; and a pair of microstrip lines making interconnection between the two first metallized patterns and the second metallized pattern in the paired electrode structure.

According to the invention the paired first metallized patterns are connected to each other by a thin film resistor while connecting these first metallized patterns to a second metallized pattern with microstrip lines. It is thus possible to obtain high isolation of the first and second metallized patterns from one another, reduce inductance fluctuations by using the microstrip lines, thus securing the balance of the individual metallized patterns to suppress interference of the first metallized patterns with one another and thus suppress operational instability, such as abnormal oscillation, of the microwave transistor.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENT OF THE INVENTION

Now, the invention is explained with reference to the accompanying drawings.

Figure 1:
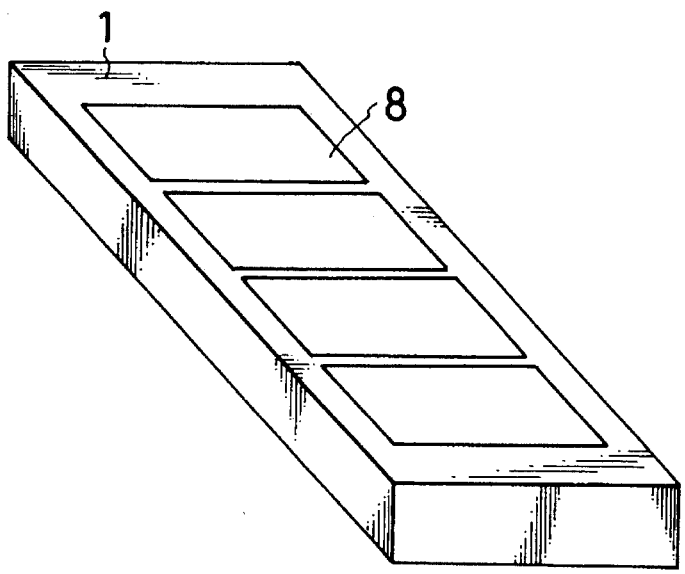
FIG. 1 is a perspective view showing a conventional microchip capacitor.
Figure 2:
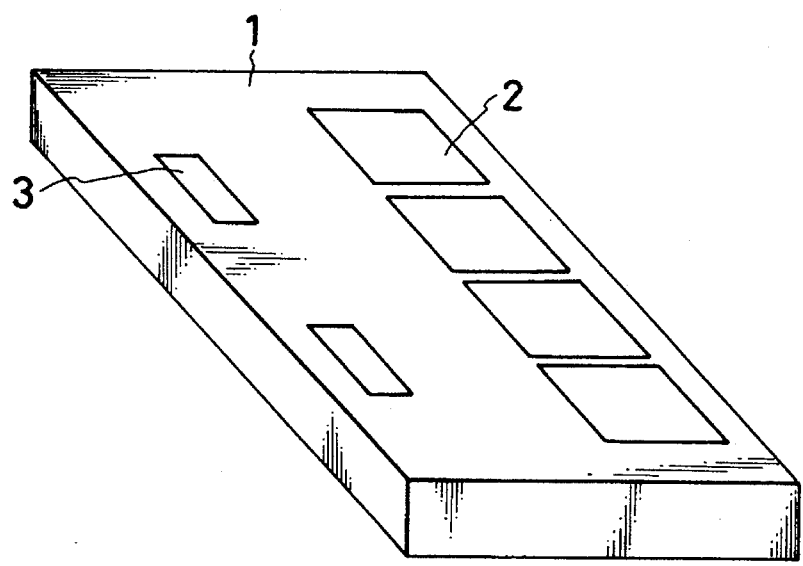
FIG. 2 is a perspective view showing another conventional microchip capacitor.
Figure 3:
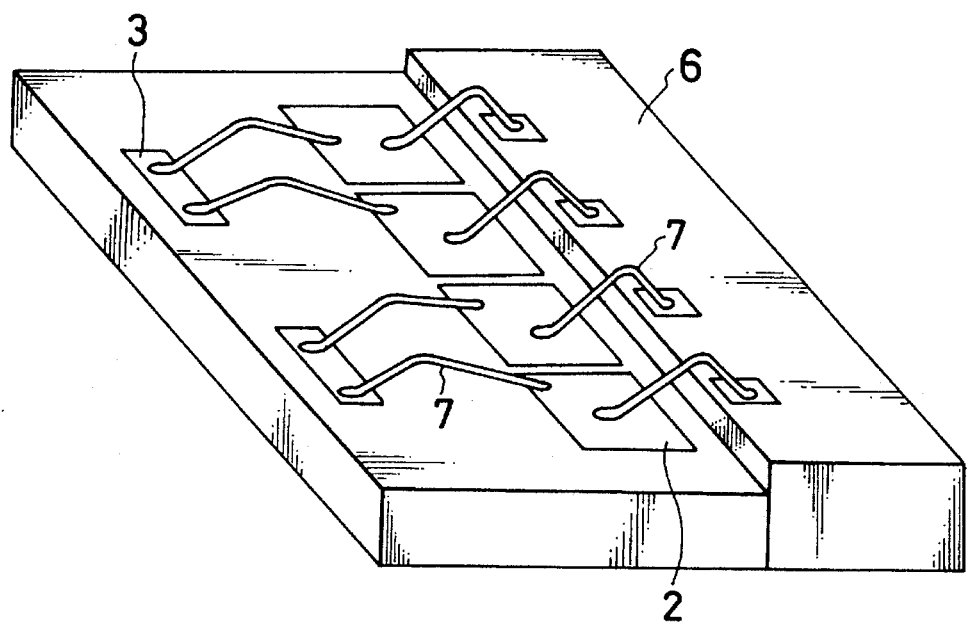
FIG. 3 is a perspective view showing an example wherein a conventional microchip capacitor of FIG. 2 is used as an internal impedance matching circuit of a microwave transistor.
Figure 4:
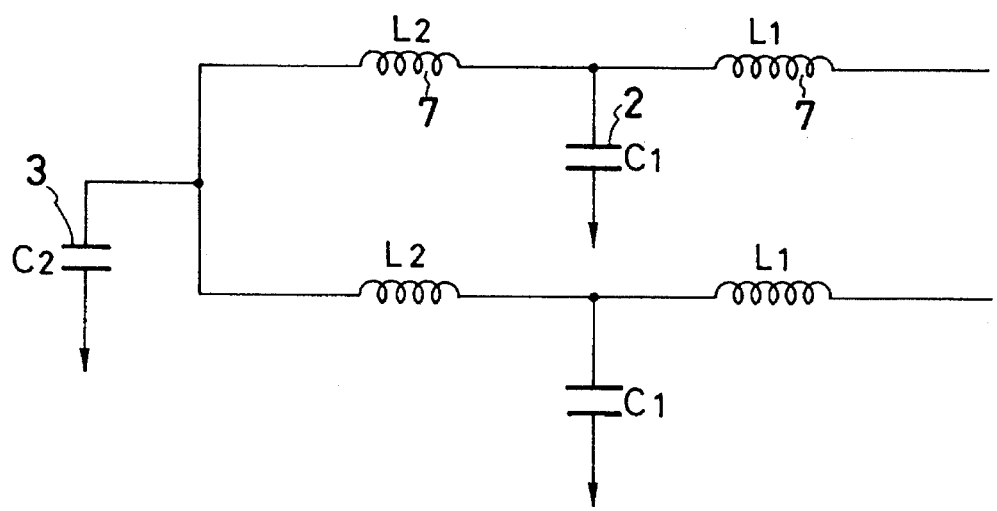
FIG. 4 is a circuit diagram showing an equivalent electric circuit of the structure shown in FIG. 3.
Figure 5:
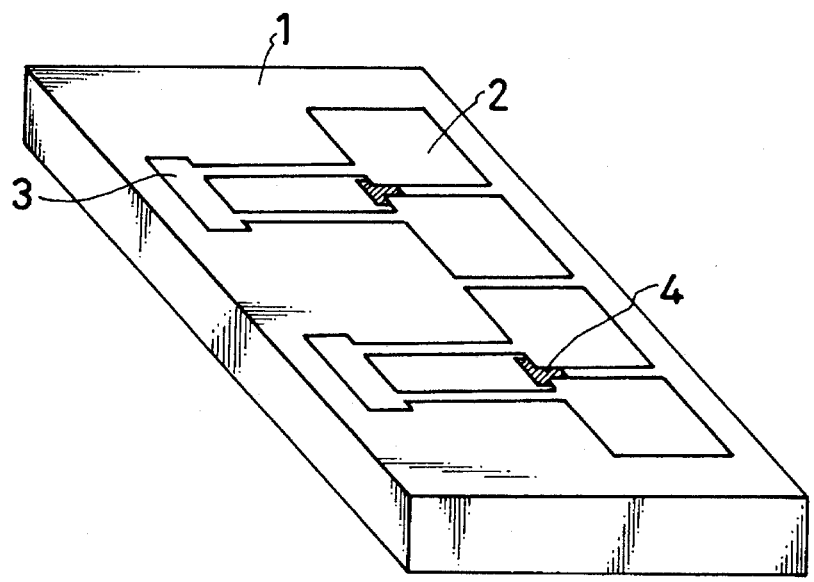
FIG. 5 is a perspective view showing a microchip capacitor of an embodiment according to the invention.

FIG. 5 shows a preferred embodiment of the microchip capacitor according to the invention. In this capacitor, the principal front surface of a dielectric substrate 1 is provided with four first metallized patterns 2 and also with second metallized patterns 3 each for two first metallized patterns 2. Two first metallized patterns 2 are connected as a pair by a thin film resistor 4. These two first metallized patterns 2 and one second metallized pattern 3 are connected as a combination by microstrip lines 5.

Figure 6:
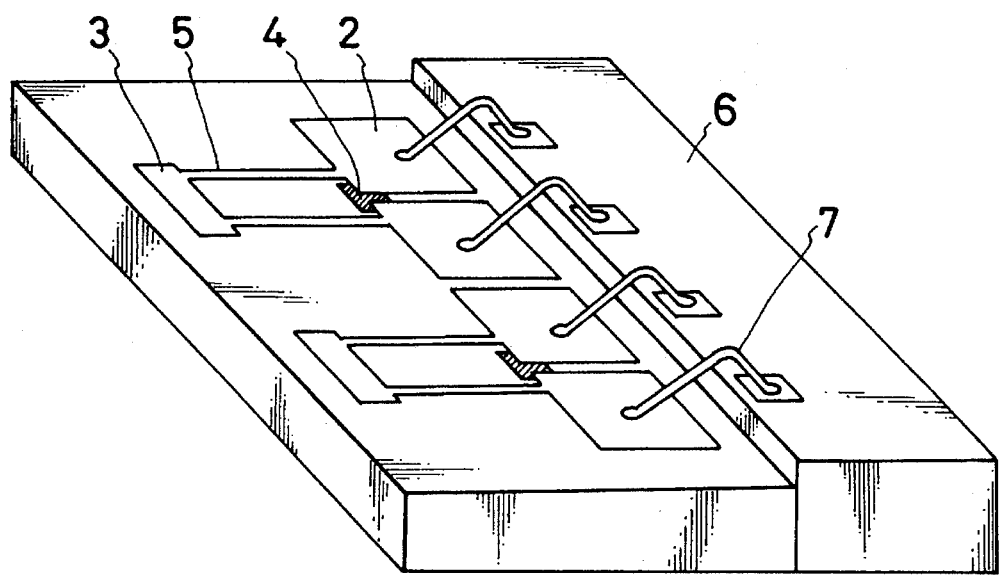
FIG. 6 is a perspective view showing an example wherein the microchip capacitor of FIG. 2 according to the invention is used as an internal impedance matching circuit of a microwave transistor.

FIG. 6 illustrates the use of this microchip capacitor as circuit elements of an internal impedance matching circuit of a microwave transistor. In this instance, a microwave transistor 6 and the first metallized patterns 2 of the embodiment of the microchip capacitor are connected to one another by bonding wires 7.

Figure 7:
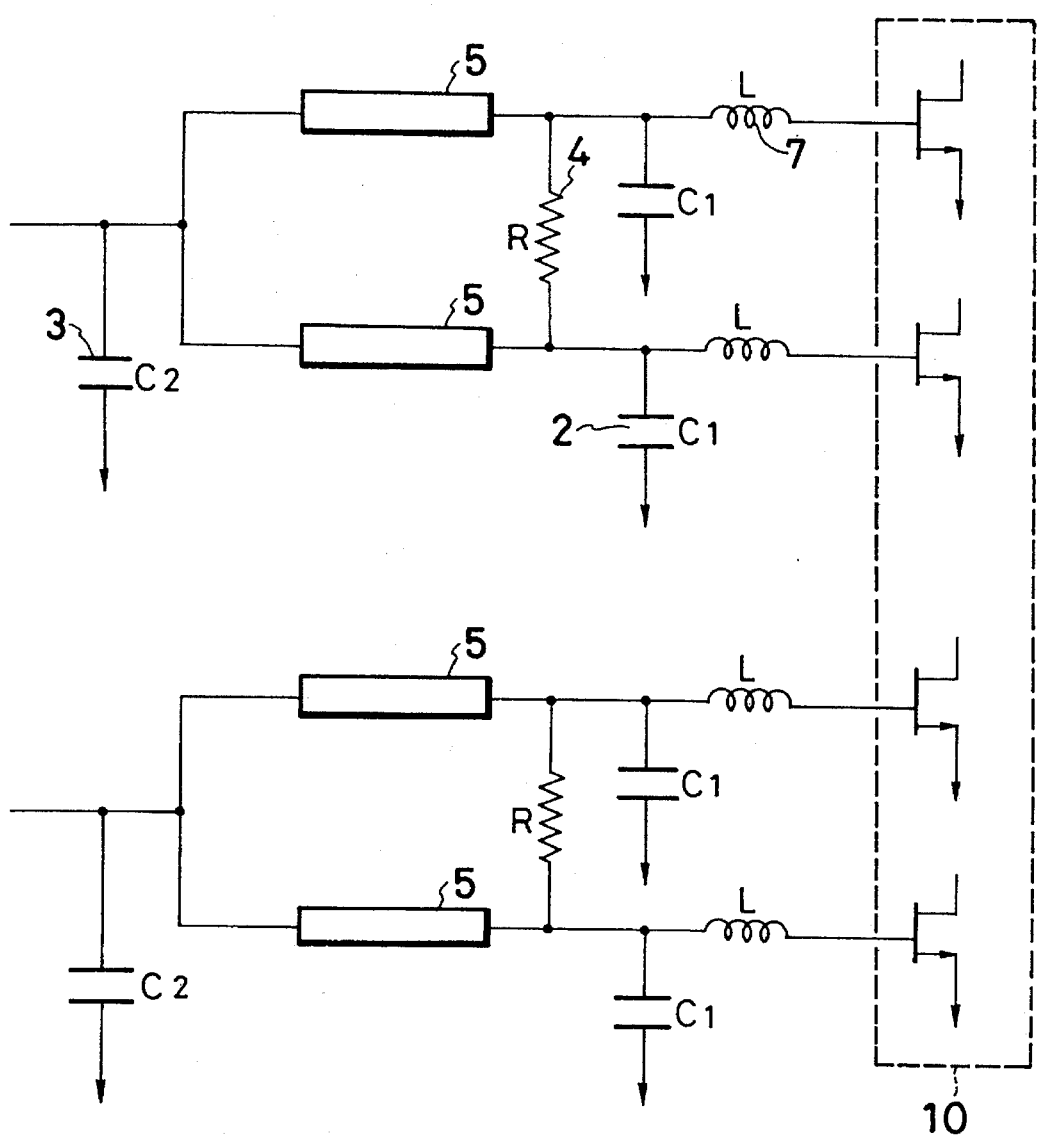
FIG. 7 is a circuit diagram showing an equivalent electric circuit of the structure shown in FIG. 6.

FIG. 7 is a circuit diagram showing an equivalent electric circuit of the structure shown in FIG. 6. The bonding wires 7 serve as inductances L connected to gates in an FET chip 10. The first and second metallized patterns 2 and 3 serve as capacitances C1 and C2, respectively. The microstrip lines 5 which have a predetermined length serve as inductive elements, that is, they have the same role as inductances. The inductors L and capacitors C1 and C2 constitute a two-stage circuit. The thin film resistors 4 provide resistances R.

The operation of this capacitor will now be described with reference to FIG. 6. Generally, the inductances of the bonding wires 7 are subject to considerable fluctuations due to assembling. Also, the internal impedance of the microwave transistor 6 is subject to fluctuations inside the chip surfaces. Therefore, the load impedances connected to the first metallized patterns 2 of the microchip capacitor become unbalanced among the individual metallized patterns. This means that a flow of signal is caused between the paired first metallized patterns 2 through the microstrip lines 5 and the thin film resistor 4.

However, in the embodiment of the microchip capacitor, the microstrip lines 5 and thin film resistor 4 form a Wilkinson type synthetic circuit such that a signal flowing through the microstrip lines 5 and a signal flowing through the thin film resistor 4 cancel each other. It is thus possible to enhance the isolation between the individual patterns and suppress interference of the patterns with one another.

In addition, the connection between the first and second metallized patterns 2 and 3 is made by using the microstrip lines 5 instead of the bonding wires 7. Thus, the inductance fluctuations are extremely small, and it is possible to maintain the impedances between the first and second patterns to be balanced.

In other words, it is possible to reduce fluctuations of the circuit constants due to the bonding wires 7 and prevent the load impedances corresponding to the individual electrodes from being out of balance.

Where the microwave transistor shown in FIG. 6 is a C-band MES FET with a gate width of 2 mm per electrode, the internal impedance is about 10 ohms at 6 GHz. However, by setting the resistance of the thin film resistors to 10 ohms, it was confirmed by simulation that the isolation can be improved by 8 dB compared to the prior art microchip capacitor, and that it is possible to obtain −19.2 dB.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A microchip capacitor having an electrode structure including a plurality of first metallized patterns and at least one second metallized pattern provided on a dielectric substrate, said first metallized patterns and said second metallized pattern constituting a paired electrode structure with two of said first metallized patterns combined with said one second metallized pattern, said electrode structure comprising:

a thin film resistor making interconnection between said two first metallized patterns in said paired electrode structure; and a pair of microstrip lines making interconnection between said two first metallized patterns and said second metallized pattern in said paired electrode structure.

2. The microchip capacitor according to claim 1, which comprises a plurality of bonding wires and in which each of said first metallized patterns is coupled to a field-effect transistor via each of said bonding wires.

3. The microchip capacitor according to claim 1, in which said microstrip lines and said thin film resistor form a synthetic circuit wherein a signal flowing in said thin film resistor and a signal flowing in said microstrip lines cancel each other.

4. The microchip capacitor according to claim 3, in which said synthetic circuit is a Wilkinson type synthetic circuit.

\* \* \* \* \*